United States Patent
Khatri

(12) 
(10) Patent No.: US 6,475,962 B1
(45) Date of Patent: Nov. 5, 2002

(54) DRY THERMAL GREASE

(75) Inventor: Prakash Khatri, Matawan, NJ (US)

(73) Assignee: AOS Thermal Compounds, LLC, Eatontown, NJ (US)

(*) Notice: Subject to any disclaimer, the term of this patent is extended or adjusted under 35 U.S.C. 154(b) by 0 days.

(21) Appl. No.: 09/661,729

(22) Filed: Sep. 14, 2000

(51) Int. Cl.$^7$ .................. C10M 113/00; H05K 7/20; F28F 7/00

(52) U.S. Cl. .................. 508/161; 508/172; 508/178; 361/704; 165/185

(58) Field of Search ................ 508/172, 178, 508/161

(56) References Cited

U.S. PATENT DOCUMENTS

| | | | |
|---|---|---|---|
| 3,669,884 A | | 6/1972 | Wright ................ 508/213 |
| 4,738,737 A | * | 4/1988 | Runde et al. ............ 156/91 |
| 4,803,100 A | | 2/1989 | Ameen et al. ........... 427/387 |
| 5,167,851 A | * | 12/1992 | Jamison et al. .......... 252/74 |
| 5,250,209 A | * | 10/1993 | Jamison et al. .......... 252/74 |
| 5,298,791 A | | 3/1994 | Liberty et al. .......... 257/707 |
| 5,904,796 A | | 5/1999 | Freuler et al. .......... 156/278 |
| 6,049,458 A | | 4/2000 | Lee et al. ............. 361/705 |
| 6,054,198 A | * | 4/2000 | Bunyan et al. .......... 428/40.5 |
| 6,059,116 A | | 5/2000 | Hinshaw et al. ......... 206/714 |
| 6,114,429 A | * | 9/2000 | Yamada et al. .......... 524/432 |
| 6,143,076 A | * | 11/2000 | Rasmussen et al. ....... 118/411 |
| 6,174,841 B1 | | 1/2001 | Yamada et al. .......... 508/172 |
| 6,255,257 B1 | | 7/2001 | Yamada et al. .......... 508/172 |
| 6,286,212 B1 | | 9/2001 | Eaton .................. 29/890.03 |

FOREIGN PATENT DOCUMENTS

| | | |
|---|---|---|
| EP | 0906945 | 4/1999 |
| WO | WO/00/36893 | 6/2000 |

OTHER PUBLICATIONS

Advanced Thermal Interface Material: 'Dry–To–The–Touch' Thermal Grease by Khatri and Ziemski, Mar., 2001 (4 pgs).
Sprayable Thermal Grease Dramatically Reduces Labor While Offering Other Unique Advantages by Khatri and Ziemski, ISPS '99 Proceedings, 1999 (pgs. 223–226).
Article entitled "Thermal Isolators," PCIM, Apr. 1999 (pp. 57–61).
Article entitled "Thermal Gap Fillers," PCIM, Sep. 1999 (pp. 24–25, 27).
Article entitled "Navigating the Maze of Thermal Interface Materials," Electronic Product Supplement, (http://www.eelctronicsproducts.com) Fall, 1999 (5 pp.).
Article entitled "Thermal Resistance of Interface Materials as a Function of Pressure," Latham, (2 pp.), (http://www.electronics–cooling.com/Resources/EC Articles/SEP96/sep96_tb.htm).
Wakefield Engineering advertisement Thermal Compounds, Adhesives, Interface Materials, Hardware, Installation Tools (1 pg.), believed dated 1997 or before.
Bergquist Company Brochure "Sil–Pad Design Guide" 1997–1998 (1 pg.).
Chomerics Company (Division of Parker–Hannifin) Advertisement, (1 pg.), from Electronics Cooling, vol. 7, No. 1, Feb. 2001.
Fujipoly Company advertisement from PCIM, Jan. 2000, p. 14.
MH&W brochure regarding Keratherm® (2 pp.), Feb. 1999.
MH&W International Corp. advertisment from Electronics Cooling, vol. 7, No. 1, Feb. 2001, p. 13.
W.L. Gore & Assoc. advertisement (1 pg.) from Electronic Packaging and Production, Jun. 2001.
Emerson & Cuming (division of National Starch and Chemical Company), advertisement (1 pg.).
Honeywell advertisement (1 pg.) from Electronics Cooling, vol. 7, No. 1, Feb. 2001.
"Electrolube's Unique Heat Transfer Compound Aerosol Optimises Board Thermal Performance," Jul. 28, 2000 website pages ( 5 pp.).
AOS brochure describing thermal greases.
Article entitled "Attaching Heat Sinks to Components," Electronic Packaging & Production, pp. 42–46, Electronic Packaging and Production, Jul. 1997.
Article entitled "Thermal Interface Materials," deSorgo et al., found at http://www.cooling–electronics.com/Resources/EC_Articles/SEP96/sep96_01.htm (6 pp.).
Article entitled "Thermal Management Materials and Designs," Electronic Packaging and Production, Oct. 2000 (pp. 50–57).
Thermalloy Company Press Release (1 pg.), Dec. 18, 1996.
Article entitled "Cooling Technologies—Work With Microprocessors Points the Way to Thermal Management Improvements for Power Semiconductors," PCIM, May 1999 (pp. 46–54).
Article entitled "Test Methods for Characterizing the Thermal Transmission Properties of Phase–change Thermal Interface Materials," (http://www.electronics–cooling.com/html1/1999_may_article1.html), May 1999 (9 pp.).
Brochure for Thermagon Company (5 pp), ©1997.
Brochure for Orcus, Inc., (3 pp.), ©1998.
Brochure for Bergquist Company (5 pp.), ©1998.
Advertisement for Bergquist Company "Thermal Performance you must see to believe," (1 pg.), undated.
Brochure for Power Devices Company (11 pp.), ©1996.

(List continued on next page.)

Primary Examiner—Ellen M. McAvoy
(74) Attorney, Agent, or Firm—Staas & Halsey LLP

(57) ABSTRACT

A heat sink material for use in electronic assemblies is disclosed. The heat sink material is a thermal grease that due its composition is dry to the touch and thus eliminates the problems associated with thermal greases in electronic assemblies.

36 Claims, No Drawings

OTHER PUBLICATIONS

Advertisement for Chomerics Company (6 pp.), Oct. 1999.
Advertisement for Chomerics Company's "Therm–A–Gap" Gap Filling Materials, (1 pg.), Oct. 1999.
Advertisement for "GAP PAD VO," (1 pg.), undated.
Advertisement for Fujipoly Company's "SARCON Thermal Management Components," (1 pg.), undated.
Advertisement for Fujipoly Company's "SARCON Heat Sink Gel Pads," (1 pg.), undated.

U.S. patent application Ser. No. 09/951,501, filed Sep. 14, 2001, Prakash.

* cited by examiner

DRY THERMAL GREASE

BACKGROUND OF THE INVENTION

The present invention is directed to a novel method and compound for providing heat sink material to electronic assemblies. Electronic assemblies generate a large amount of heat during operation. In order for the electronics to operate properly and reliably for extended periods of time, the heat generated during operation must be efficiently and reliably removed. With the advent of micro-electronic assemblies, the difficulties associated with the efficient and reliable removal of heat are magnified.

Generally as is well known to those of ordinary skill in the art, electronic assemblies are fabricated with certain components attached to a printed circuit board. The heat generated by the components must be transferred in some manner from the component to a heat sink. If electronic components are attached directly to the printed circuit board or to another solid heat sink device such as fins, there will be voids between the components and the other solid material due to the irregular nature of the solid to solid contact. Since air is a poor conductor of heat, these voids must be filled with thermally conductive material so that the heat generated by the electronic components can be effectively removed from the assembly. There are a variety of materials and techniques that have been used in order to fill these voids with thermally conductive materials such as thermal grease, wax or paraffin materials.

Although thermal grease is an excellent conductor of heat, there are many problems with the application of thermal grease. Thermal grease is messy, time consuming to apply, and moist to the touch. In addition, during operation of the electronics when heat is being generated, the thermal grease will migrate away from the area of application. It should also be noted that the use of other heat conducting materials such as wax or paraffin also present the same problems.

SUMMARY OF THE INVENTION

The object of the present invention is to provide a heat sink compound containing thermal grease that takes advantage of the high thermal conductivity of the grease but that does not suffer from the disadvantages of prior thermal greases set forth above. A further object of the present invention is to provide a thermal-grease mixture that is dry to the touch and naturally tacky and may be formed into various shapes such as sheets, blocks etc. to facilitate its application as a heat sink material for electronic components.

The present invention is directed to a method for providing a thermal interface material to electronic component assemblies comprising the following steps: providing a heat generating electronic component with a first mounting surface; providing a second mounting surface on a heat dissipating component upon which the first mounting surface of the heat generating electronic component is to be mounted; and disposing dry thermal grease to effectuate heat transfer between the heat generating electronic component and the heat dissipating component between the first mounting surface and the second mounting surface.

DETAILED DESCRIPTION OF THE INVENTION

The present invention is directed to a heat sink material and method for applying the same to electronic components. The heat sink material of the present invention is a compound containing thermal grease but, due to the composition of the compound, is dry to the touch but is also naturally tacky. In addition, the material will not suffer a change in viscosity during use when heat is applied and thereby will not migrate away from the area of application.

It is presently contemplated that the dry grease of the present invention can be prepared for use in two forms. The first form may be used to provide a thin layer of the dry grease on a foil backing so that the dry grease can be cut out to fit a variety of different shapes of the electrical components. The second form is provided in the form of blocks or other shapes that can be used to fill larger gaps in or around components. Given the difference in forms, there are slight variations in the formulation for the dry grease. However, the present invention should not be limited to these particular formulations since it will be obvious to those of ordinary skill in the art that other equivalent materials may be substituted for the materials in the formulations described below as well as different application methods.

Both forms of the dry grease are based on a mixture of components referred to as the heat sink compound pre-blend (hereinafter "HSC Pre-Blend"). The HSC Pre-Blend is made up of 98.8% by weight of Polyol Ester and 1.2% by weight of an anti-oxidant.

The form of the dry grease to be used in the foil application is comprised of the components and weight percentages set forth on Table I:

TABLE I

| Component | Percentage by Weight |
| --- | --- |
| HSC Pre-Blend | 9 |
| Zinc Oxide Powder (Filler) | 72.8 |
| High Viscosity Oil | 5 |
| Surfactant | 0.2 |
| Polystyrene Based Polymer | 3 |
| Naphtha (Solvent) | 1 |

The form of the dry grease to be used in the block application is comprised of the components and weight percentages set forth in Table II.

TABLE II

| Components | Weight Percentages |
| --- | --- |
| HSC Pre-Blend | 11.2 |
| Zinc Oxide Powder | 20.1 |
| Magnesium Oxide | 60.9 |
| Aluminum Silicate | 5.2 |
| High Viscosity Oil | 2.5 |

In this formulation, the Zinc Oxide and Magnesium Oxide are used as filler material. The Aluminum Silicate is a clay-like Material used to form the grease into a thicker material that can be formed into blocks or other shapes.

With either formulation of the present invention, the result is a compound with the high thermal conductivity normally associated with thermal greases. However, the compound itself is dry to the touch so the difficulties of dealing with conventional messy greases are alleviated. In addition, the material will not lose its viscosity and become runny after application during the application of continuous heat or pressure or if applied on a vertical surface. Although the resulting compound will be dry to the touch, it is also naturally tacky and can be applied without an adhesive. Thus, the heat transfer properties of the present compound will not be degraded by the use of an adhesive that is not as thermally conductive as the compound.

The first form of the dry grease can be applied in a variety of contemplated methods. First, the dry grease could be combined with a solvent and/or propellant and applied by spray directly to the electronic components in the desired thickness. Second, the dry grease can be screen printed directly onto the electronic component. In either case, the dry grease will become dry to the touch within a few seconds of application. This first form of the dry grease can also be pre-applied to a thermally-conductive foil material in a thickness varying from 1 mil to 4 mil. In this type of application, the dry grease and foil can be cut into the desired shape for the electronic component and attached thereto with or without adhesive or by other means known to those of ordinary skill in the art.

The second form of the dry grease made with the aluminum silicate is formed into blocks or other shapes with a thickness generally much greater than those associated with the first form. These blocks can be shaped to fit any desired gap between components. As with the first form, the final block of the dry grease is dry to the touch and non-tacky.

Those of ordinary skill in the art will recognize that the embodiments just described merely illustrate the principles of the present invention. Many modifications may be made thereto without departing from the spirit and scope of the invention as set forth in the following claims.

What is claimed is:

1. A method for providing a thermal interface material to an electronic component assembly, comprising the following steps:
    a) providing a heat generating electronic component with a first mounting surface;
    b) providing a second mounting surface on a heat dissipating component upon which the first mounting surface of the heat generating electronic component is to be mounted; and
    c) disposing dry thermal grease between the first mounting surface of the heat generating electronic component and the second mounting surface of the heat dissipating component to effectuate heat transfer therebetween,
        wherein the dry thermal grease includes
            a heat sink compound pre-blend made up of Polyol Ester and an Antioxidant,
            high viscosity oil,
            Zinc Oxide Powder as a filler,
            polyglycolether as a surfactant,
            a Polystyrene based polymer, and
            Naptha as a solvent.

2. A method for providing a thermal interface material to an electronic component assembly, comprising the following steps:
    a) providing a heat generating electronic component with a first mounting surface;
    b) providing a second mounting surface on a heat dissipating component upon which the first mounting surface of the heat generating electronic component is to be mounted; and
    c) disposing dry thermal grease between the first mounting surface of the heat generating electronic component and the second mounting surface of the heat dissipating component to effectuate heat transfer therebetween,
        wherein the dry thermal grease includes a heat sink compound pre-blend made up of Polyol Ester and an antioxidant,
        high viscosity oil,
        Zinc Oxide and Magnesium Oxide as a filler material, and
        aluminum silicate.

3. The method of claim 1, whereby the dry thermal grease is disposed between the heat generating electronic component and the heat dissipating component by spraying the dry thermal grease onto the first mounting surface.

4. The method of claim 1, whereby the dry thermal grease is disposed between the heat generating electronic component and the heat dissipating component by the following steps:
    a) shaping a block of the dry thermal grease to fit a shape of a gap between the first mounting surface and the second mounting surface; and
    b) placing the block in the gap between the first mounting surface and the second mounting surface.

5. The method of claim 1, wherein the first mounting surface has a shape, and
    whereby, the dry thermal grease is disposed between the heat generating electronic component and the heat dissipating component by the following steps:
        a) disposing a relatively thin layer of the dry thermal grease onto a thermally conductive foil sheet;
        b) cutting the dry thermal grease and foil sheet in the shape of the first mounting surface; and
        c) attaching the dry thermal grease and foil to the first mounting surface.

6. The method of claim 1, wherein the pre-blend is 9% by weight of the dry thermal grease.

7. The method of claim 1, wherein the Polyol Ester is 98.89% by weight of the pre-blend, and the Antioxidant is 1.2% by weight of the pre-blend.

8. The method of claim 1, wherein the high viscosity oil is 5% by weight of the dry thermal grease.

9. The method of claim 1, wherein the Zinc Oxide Powder is 72.8% by weight of the dry thermal grease.

10. The method of claim 1, wherein the polyglycolether is 0.2% by weight of the dry thermal grease.

11. The method of claim 1, wherein the Polystyrene based polymer is 3% by weight of the dry thermal grease.

12. The method of claim 1, wherein the Naptha is 1% by weight of the dry thermal grease.

13. A method for applying a thermal interface material, comprising the following steps:
    a) providing a heat generating component with a first surface;
    b) providing a heat dissipating component with a first surface; and
    c) disposing dry thermal grease between the first surfaces to effectuate heat transfer therebetween,
        wherein the dry thermal grease includes a pre-blend compound made up of Polyol Ester and an Antioxidant, as well as a high viscosity oil, a Zinc Oxide Powder as a filler, a polyglycolether as a surfactant, a Polystyrene based polymer, and Naptha as a solvent,
        wherein the pre-blend compound is 9% by weight of the dry thermal grease,
        wherein the high viscosity oil is 5% by weight of the dry thermal grease,
        wherein the Zinc Oxide Powder is 72.8% by weight of the dry thermal grease,
        wherein the polyglycolether is 0.2% by weight of the dry thermal grease,
        wherein the Polystyrene based polymer is, 3% by weight of the dry thermal grease, and wherein the Naptha is 1% by weight of the dry thermal grease.

14. The method of claim 13, wherein the Polyol Ester is 98.8% by weight of the pre-blend compound, and the Antioxidant is 1.2% by weight of the pre-blend compound.

15. The method of claim 13,
wherein the disposing step includes the step of:
spraying the dry thermal grease onto at least one of the first surfaces.

16. The method of claim 13, wherein the disposing step includes the following steps:
a) shaping a block of the dry thermal grease to fit a shape of a gap between the first surfaces; and
b) placing the block in the gap between the first surfaces.

17. The method of claim 13, wherein the first surface of the heat generating component has a shape, and
wherein the disposing step includes the following steps:
a) disposing a relatively thin layer of the dry thermal grease onto a thermally conductive sheet;
b) cutting the dry thermal grease and sheet into the shape of the first surface of the heat generating component; and
c) attaching the dry thermal grease and sheet to one of the first surfaces.

18. The method of claim 13, wherein the first surface of the heat generating component has a shape, and
wherein the disposing step includes the following steps:
a) disposing a relatively thin layer of the dry thermal grease onto a thermally conductive sheet;
b) cutting the dry thermal grease and sheet to the shape of the first surface of the heat dissipating component;
c) attaching the dry thermal grease and sheet to one of the first surfaces.

19. A method for providing a thermal interface material to an electronic component assembly, consisting of the following steps:
a) providing a heat generating electronic component with a first mounting surface;
b) providing a second mounting surface on a heat dissipating component upon which the first mounting surface of the heat generating electronic component is to be mounted; and
c) disposing dry thermal grease between the first mounting surface of the heat generating electronic component and the second mounting surface of the heat dissipating component to effectuate heat transfer therebetween,
wherein the dry thermal grease includes
a heat sink pre-blend compound made up of Polyol Ester and an Antioxidant, as well as a high viscosity oil, a Zinc Oxide Powder as a filler, a polyglycolether as a surfactant, a Polystyrene based polymer, and Naptha as a solvent.

20. A method for applying a thermal interface material, consisting of the following steps:
a) providing a heat generating component with a first surface;
b) providing a heat dissipating component with a first surface; and
c) disposing dry thermal grease between the first surfaces to effectuate heat transfer therebetween,
wherein the dry thermal grease includes a pre-blend compound made up of Polyol Ester and an Antioxidant, as well as a high viscosity oil, a Zinc Oxide Powder as a filler, a polyglycolether as a surfactant, a Polystyreme based polymer, and Naptha as a solvent,
wherein the pre-blend compound is 9% by weight of the dry thermal grease,
wherein the high viscosity oil is 5% by weight of the dry thermal grease,
wherein the Zinc Oxide Powder is 72.8% by weight of the dry thermal grease,
wherein the polyglycolether is 0.2% by weight of the dry thermal grease,
wherein the Polystyrene based polymer is 3% by weight of the dry thermal grease, and
wherein the Naptha is 1% by weight of the dry thermal grease.

21. The method of claim 2, whereby the dry thermal grease is disposed between the heat generating electronic component and the heat dissipating component by spraying the dry thermal grease onto the first mounting surface.

22. The method of claim 2, whereby the dry thermal grease is disposed between the heat generating electronic component and the heat dissipating component by the following steps:
a) shaping a block of the dry thermal grease to fit a shape of a gap between the first mounting surface and the second mounting surface; and
b) placing the block in the gap between the first mounting surface and the second mounting surface.

23. The method of claim 2, wherein the first mounting surface has a shape, and
whereby the dry thermal grease is disposed between the heat generating electronic component and the heat dissipating component by the following steps:
a) disposing a relatively thin layer of the dry thermal grease onto a thermally conductive foil sheet;
b) cutting the dry thermal grease and foil sheet into the shape of the first mounting surface; and
c) attaching the dry thermal grease and foil to the first mounting surface.

24. The method of claim 2, wherein the pre-blend is 11.2% by weight of the dry thermal grease.

25. The method of claim 2, wherein the Polyol Ester is 98.8% by weight of the pre-blend, and the Antioxidant is 1.2% by weight of the pre-blend.

26. The method of claim 2, wherein the high viscosity oil is 2.5% by weight of the dry thermal grease.

27. The method of claim 2, wherein the Zinc Oxide Powder is 20.1% by weight of the dry thermal grease and the Magnesium Oxide powder is 60.9% by weight of the dry thermal grease.

28. The method of claim 2, wherein the aluminum silicate is 5.2% by weight of the dry thermal grease.

29. A method for applying a thermal interface material, comprising the following steps:
a) providing a heat generating component with a first surface;
b) providing a heat dissipating component with a first surface; and
c) disposing dry thermal grease between the first surfaces to effectuate heat transfer therebetween,
wherein the dry thermal grease includes a pre-blend compound made up of Polyol Ester and an antioxidant, as well as a high viscosity oil, a Zinc Oxide and a Magnesium Oxide as a filler material, and an aluminum silicate,
wherein the pre-blend compound is 11.2% by weight of the dry thermal grease,
wherein the high viscosity oil is 2.5% by weight of the dry thermal grease, wherein the Zinc Oxide powder is 20.1% by weight of the dry thermal grease, and the Magnesium Oxide powder is 60.9% by weight of the dry thermal grease, and wherein the aluminum silicate is 5.2% by weight of the dry thermal grease.

30. The method of claim 29, wherein the Polyol Ester is 98.8% by weight of the pre-blend compound, and the Antioxidant is 1.2% by weight of the pre-blend compound.

31. The method of claim 29, wherein the disposing step includes the step of:

spraying the dry thermal grease onto at least one of the first surfaces.

32. The method of claim 29, wherein the disposing step includes the following steps:

a) shaping a block of the dry thermal grease to fit a shape of a gap between the first surfaces; and b) placing the block in the gap between the first surfaces.

33. The method of claim 29, wherein the first surface of the heat generating component has a shape, and wherein the disposing step includes the following steps:

a) disposing a relatively thin layer of the dry thermal grease onto a thermally conductive sheet;

b) cutting the dry thermal grease and sheet into the shape of the first surface of the heat generating component; and c) attaching the dry thermal grease and sheet to one of the first surfaces.

34. The method of claim 29, wherein the first surface of the heat generating component has a shape, and wherein the disposing step includes the following steps:

a) disposing a relatively thin layer of the dry thermal grease onto a thermally conductive sheet;

b) cutting the dry thermal grease and sheet into the shape of the first surface of the heat dissipating device; and c) attaching the dry thermal grease and sheet to one of the first surfaces.

35. A method for providing a thermal interface material to an electronic component assembly, consisting of the following steps:

a) providing a heat generating electronic component with a first mounting surface;

b) providing a second mounting surface on a heat dissipating component upon which the first mounting surface of the heat generating electronic component is to be mounted; and c) disposing dry thermal grease between the first Mounting surface of the heat generating electronic component and the second mounting surface of the heat dissipating component to effectuate heat transfer therebetween, wherein the dry thermal grease includes a heat sink pre-blend compound made up of Polyol Ester and an antioxidant, as well as a high viscosity oil, a Zinc Oxide and a Magnesium Oxide as a filler material, and an aluminum silicate.

36. A method for applying a thermal interface material, consisting of the following steps:

a) providing a heat generating component with a first surface;

b) providing a heat dissipating component with a first surface; and c) disposing dry thermal grease between the first surfaces to effectuate heat transfer therebetween, wherein the dry thermal grease includes a pre-blend compound made up of Polyol Ester and an antioxidant, as well as a high viscosity oil, a Zinc Oxide and a Magnesium Oxide as a filler material, and an aluminum silicate, wherein the pre-blend compound is 11.2% by weight of the dry thermal grease.

wherein the high viscosity oil is 2.5% by weight of the dry thermal grease, wherein the Zinc Oxide Power is 20.1% by weight of the dry thermal grease and the Magnesium Oxide powder is 60.9% by weight of the dry thermal grease, and wherein the aluminum silicate is 5.2% by weight of the dry thermal grease.

* * * * *